(12) United States Patent
Kronholz et al.

(10) Patent No.: US 8,796,080 B2
(45) Date of Patent: Aug. 5, 2014

(54) METHODS OF EPITAXIALLY FORMING MATERIALS ON TRANSISTOR DEVICES

(75) Inventors: Stephan Kronholz, Dresden (DE); Hans-Juergen Thees, Dresden (DE); Peter Javorka, Radeburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 168 days.

(21) Appl. No.: 13/287,466

(22) Filed: Nov. 2, 2011

(65) Prior Publication Data

US 2013/0105917 A1    May 2, 2013

(51) Int. Cl.
*H01L 29/772* (2006.01)
*H01L 21/336* (2006.01)

(52) U.S. Cl.
USPC .......................................................... 438/163

(58) Field of Classification Search
USPC .......................................................... 438/163
See application file for complete search history.

(56) References Cited

U.S. PATENT DOCUMENTS

2005/0062080 A1 *   3/2005   Nakamura et al. ............ 257/288

* cited by examiner

*Primary Examiner* — Robert Carpenter
(74) *Attorney, Agent, or Firm* — Amerson Law Firm, PLLC

(57) ABSTRACT

Disclosed herein are various methods of epitaxially forming materials on transistor devices. In one example, the method includes forming an isolation region in a semiconducting substrate that defines an active area, performing a heating process on the active area to cause an upper surface of the active area to become a curved surface and performing an etching process on the active area to define a recess having a curved bottom surface. The method further includes the steps of forming a channel semiconductor material in the recess with a curved upper surface and forming a gate structure for a transistor above the curved upper surface of the channel semiconductor material.

13 Claims, 6 Drawing Sheets

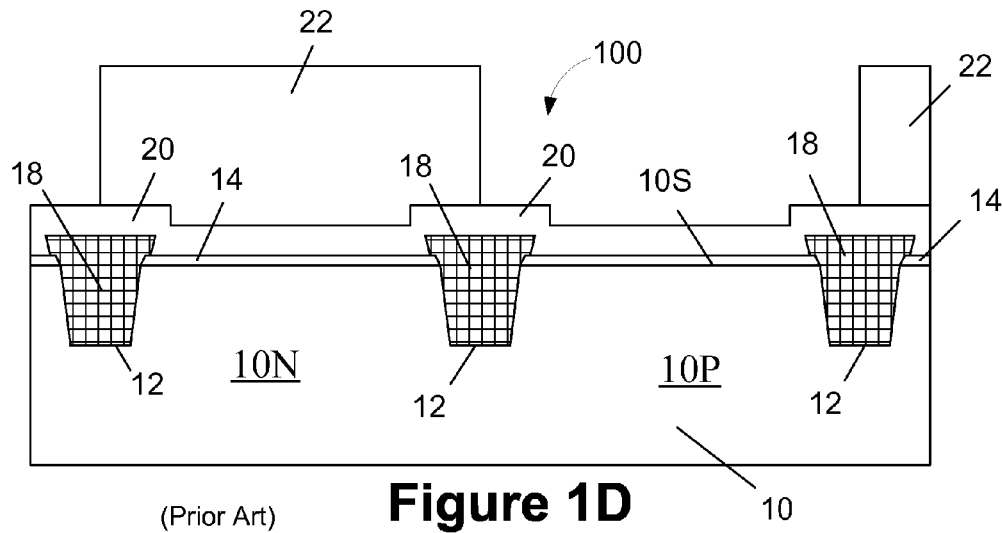
(Prior Art) Figure 1D
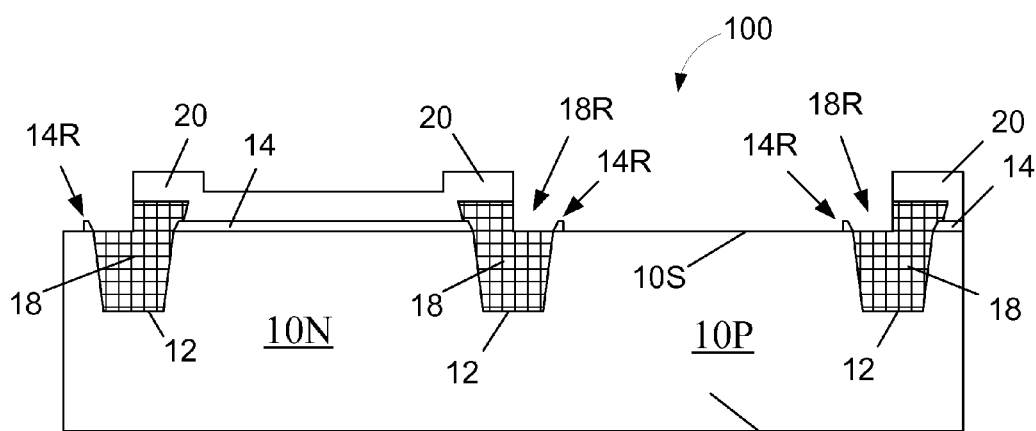
(Prior Art) Figure 1E
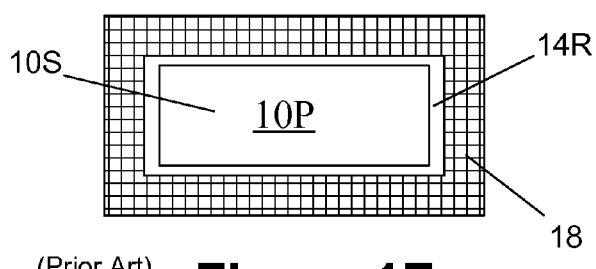
(Prior Art) Figure 1F

METHODS OF EPITAXIALLY FORMING MATERIALS ON TRANSISTOR DEVICES

BACKGROUND OF THE INVENTION

1. Field of the Invention

Generally, the present disclosure relates to the manufacturing of sophisticated semiconductor devices, and, more specifically, to various methods of epitaxially forming materials on transistor devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NFET and PFET transistors) represent one important type of circuit elements that substantially determine performance of the integrated circuits. A basic field effect transistor comprises a source region, a gate region and a channel region positioned between the source and drain regions. Such a transistor further includes a gate insulation layer positioned above the channel region and a gate electrode positioned above the gate insulation layer. When an appropriate voltage is applied to the gate electrode, the channel region becomes conductive and current may flow from the source region to the drain region. In many cases, the gate electrodes are made of polysilicon. The basic structure of a field effect transistor is typically formed by forming various layers of material and thereafter patterning those layers of material using known photolithography and etching processes. Various doped regions, e.g., source regions, drain regions, halo regions, etc., are typically formed by performing one or more ion implantation processes through a patterned mask layer using an appropriate dopant material, e.g., an N-type dopant or a P-type dopant, to implant the desired dopant material into the substrate. The particular dopant selected depends on the specific implant region being formed and the type of device under construction, i.e., an NFET transistor or a PFET transistor. During the fabrication of complex integrated circuits millions of transistors, e.g., NFET transistors and/or PFET transistors are formed on a substrate by performing a number of process operations.

The various transistors and other semiconductor devices that are formed on a semiconducting substrate typically have to be electrically isolated from one another so that the devices will operate properly. This electrical isolation is typically achieved by forming various isolation regions, such as so-called shallow trench isolation regions, in the substrate by performing a variety of known processing operations. It is very important that such isolation structures perform their function and thus it is very important that, to the extent possible, such isolation structures be formed without any voids in the insulating material.

Given the advance of the past years in reducing the physical size of transistor devices, device designers have employed a variety of techniques other that physical size reduction in an effort to improve device performance, e.g., the use of high-k dielectrics, the use of metal gate electrode structures, the incorporation of work function metals in the gate electrode structure and the use of channel stress engineering techniques on transistors (create a tensile stress in the channel region for NFET transistors and create a compressive stress in the channel region for PFET transistors). One performance-enhancing technique that has been employed in manufacturing PFET transistors involves the use of a silicon germanium channel layer. Such a silicon germanium channel layer is typically formed by forming a recess in an active region of a substrate where such a PFET transistor will be formed and thereafter, performing an epitaxial deposition process to form a layer of silicon germanium in the recess. The incorporation of the silicon germanium channel layer enhances the performance of the PFET transistor by bringing the threshold voltage of the device to a desired level (adjusting the work function to the needs of high-k metal gates).

FIGS. 1A-1H depict one illustrative prior art process flow for forming a silicon germanium channel regions for an illustrative PFET transistor. FIG. 1A depicts an illustrative prior art device 100 at an early stage of manufacture. The device 100 is formed above an illustrative bulk substrate 10. As shown therein, a plurality of trenches 12 are formed in the substrate 10 where isolation regions will be formed to define an N-active area 10N and a P-active region 10P. An illustrative pad oxide 14 is formed on the surface 10S of the substrate 10 and a so-called pad nitride layer 16 is formed on the pad oxide layer 16. The layers 14, 16 may be formed using traditional tools and techniques. The trenches 12 may be formed by performing one or more known etching techniques through a patterned mask layer (not shown), e.g., a photoresist mask.

Next, as shown in FIG. 1B, a trench isolation structure 18 is formed in the trenches 12 using traditional techniques. For example, a layer of trench isolation material, e.g., silicon dioxide, may be blanket-deposited across the substrate 10 and a chemical mechanical polishing (CMP) process may be performed (using the pad nitride layer 16 as a polish stop) to remove the excess material positioned outside of the trenches 12, thereby resulting in the shallow trench isolation structures 18.

As device dimensions have decreased over recent years and technology generations, the space between adjacent transistors has also decreased. This increased density has, in some cases, made it difficult to form void-free isolation structures 18. In an effort to overcome this problem, after the trenches 12 are initially formed, at least some prior art techniques included the step of "pulling-back" the nitride pad layer 16, as indicated by the reference number 17 in FIG. 1A. This was typically accomplished by performing an etching process using an etchant like, for example, $H_3PO_4$. In effect, this "pull-back" was an attempt to make the opening of the trenches 12 wider so that filling of the trenches 12 would be easier, with the hope of reducing the creation of undesirable voids in the final shallow trench isolation structures 18.

After the trench isolation structures 18 are formed, an etching process is performed to remove the pad nitride layer 16, as shown in FIG. 1C. Then a shown in FIG. 1D, a hard mask 20 is deposited on the device 100. The hard mask 20 may be a layer of silicon dioxide or silicon nitride having a thickness of about 20-30 nm, and it may be formed by performing a chemical vapor deposition (CVD) process. A mask layer 22, e.g., a photoresist mask, is formed that covers the N-active area 10N and exposes the P-active area 10P for further processing.

Next, as shown in FIG. 1E, the photoresist mask 22 is used during an etching process that is performed to remove the hard mask 20 and the pad oxide 14 in the exposed P-active region 10P. Typically, this is accomplished by performing a wet etching process. The oxide hard mask 20 and the oxide shallow trench isolation structures 18 tend to have higher wet etching rates than does the pad oxide layer 14. As indicated, portions of the shallow trench isolation structures 18 are removed during this etching process, as indicated by the reference number 18R. Additionally, a portion of the pad oxide layer 14 is, in effect, protected by the over-hang of the shallow trench isolation regions 18 during the etching process. As a result, when the etching process is completed, there tends to be pad oxide remnants 14R, for example in the form of a ring in some cases that remains on the P-active region 10P. FIG. 1F is a plan view of the P-active region 10P depicting the pad oxide remnants 14R in the form of a ring. The pad oxide remnants 14R may not be continuous as depicted in FIG. 1F, and it may have a width (when viewed in FIG. 1F) of about 6-9 nm, depending upon the particular application.

Next, as shown in FIG. 1G, an etching process is performed to define a recess 26 in the P-active region 10P. Ultimately, a silicon germanium channel material for a PFET transistor will be formed in the recess 26. Unfortunately, the pad oxide remnants 14R tends to act as a mask during the etching of the substrate 10 thereby resulting in protrusion or "teeth" 30 of substrate 10 in the P-active area 10P. Prior art efforts to remove the pad oxide remnants 14R also raise additional issues. For example, if a cleaning process is performed for a sufficient duration to completely remove the pad oxide remnants 14R, the shallow trench isolation structure 18 is also attacked, thereby tending to reduce the effectiveness of the isolation structure 18. If the cleaning process is reduced so as to not excessively attack the isolation structures 18, then the surface 10S of the P-active region 10P may be insufficiently cleaned and/or, in a worst-case scenario, portions of the pad oxide remnants 14R remain in place and effectively serve as a mask during the etching process that forms the recess 26. This latter masking effect is depicted in FIG. 1G and results in the formation of the undesirable protrusions 30 discussed above.

As shown in FIG. 1H, the next process involves the formation of a layer of channel semiconductor material 32 in the recess 26. Prior to forming the channel semiconductor material 32, the device 100 was typically subjected to a heating or baking process, e.g., about 800° C. for a duration of about 30-60 minutes using about 4 slm of hydrogen ($H_2$). In one illustrative example, the channel semiconductor material 32 is a layer of silicon germanium that is formed by performing an expitaxial deposition process. Unfortunately, the presence of the protrusions 30 causes the ends 34 of the semiconductor material 32 to take on an irregular shape—more or less a facetted shaped—proximate the border of the P-active area 10P. The actual shape of the irregularly-shaped ends 34 depends upon factors such as the amount of loss of the isolation structures 18 and the magnitude and shape of the protrusions 30. These irregularly-shaped ends 34 are not beneficially to the performance of the PFET transistor that will ultimately be formed in and above the P-active region 10P because, to a great extent, the threshold voltage of the PFET transistor is determined by the thickness of the semiconductor material 34. Thus, thickness variations in the channel semiconductor material is generally not desired and such thickness variations may lead to reduced performance capabilities of the PFET transistor.

The present disclosure is directed to various methods of forming expitaxially formed layers of material and semiconductor devices incorporating such layers of materials that may at least reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of epitaxially forming materials on transistor devices. In one example, the method includes forming an isolation region in a semiconducting substrate that defines an active area, performing a heating process on the active area to cause an upper surface of the active area to become a curved surface and performing an etching process on the active area to define a recess having a curved bottom surface. The method further includes the steps of forming a channel semiconductor material in the recess with a curved upper surface and forming a gate structure for a transistor above the curved upper surface of the channel semiconductor material.

In one illustrative embodiment, a device disclosed herein includes a channel region comprised of a semiconductor material having a curved upper surface, a gate insulation layer formed above the curved upper surface and a gate electrode formed above the gate insulation layer.

BRIEF DESCRIPTION OF THE DRAWINGS

The disclosure may be understood by reference to the following description taken in conjunction with the accompanying drawings, in which like reference numerals identify like elements, and in which:

FIG. 1A-1H depict one illustrative prior art technique employed to form epitaxial silicon germanium on a PFET device.

Figure 1A:
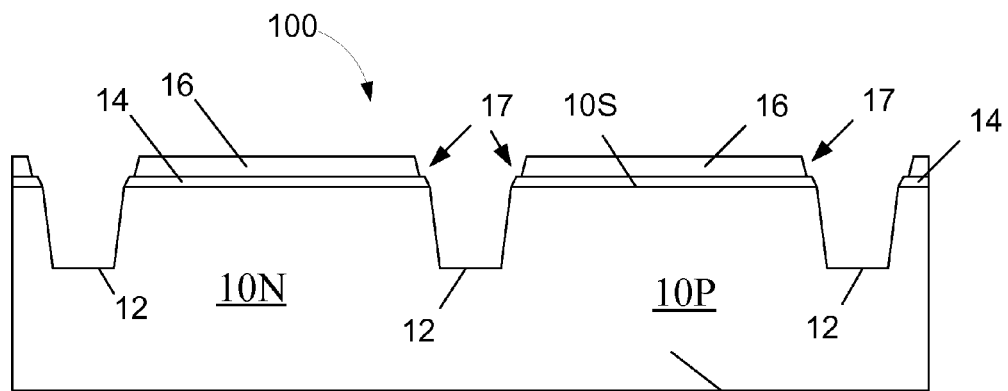
Figure 1B:
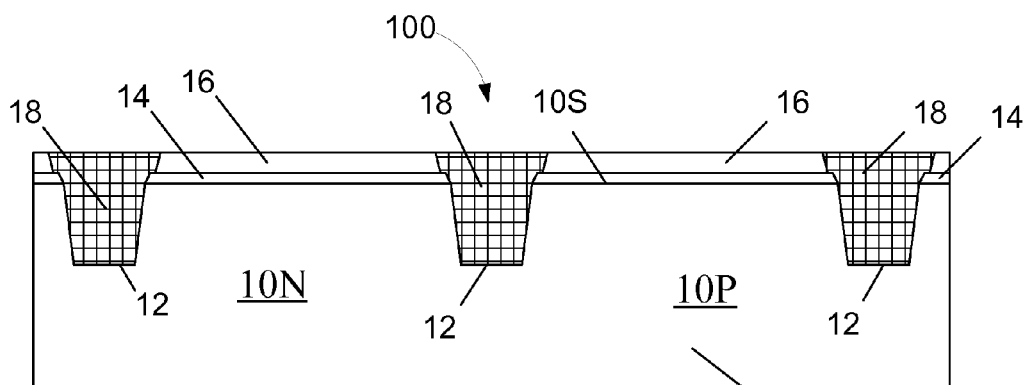
Figure 1C:
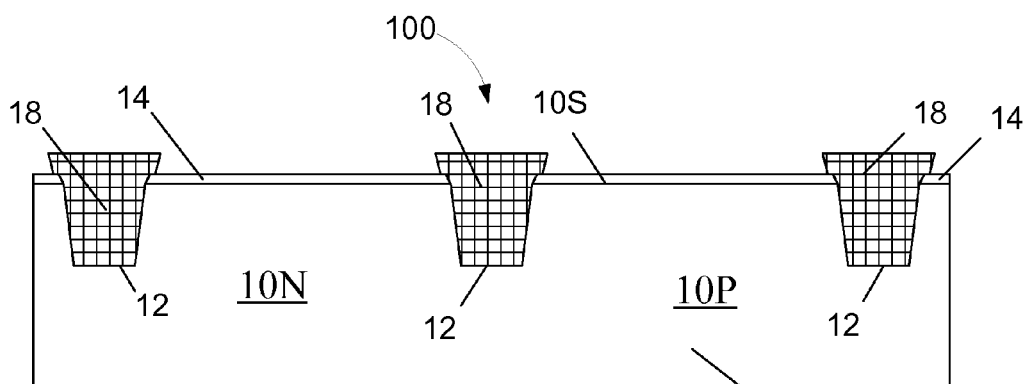
Figure 1G:
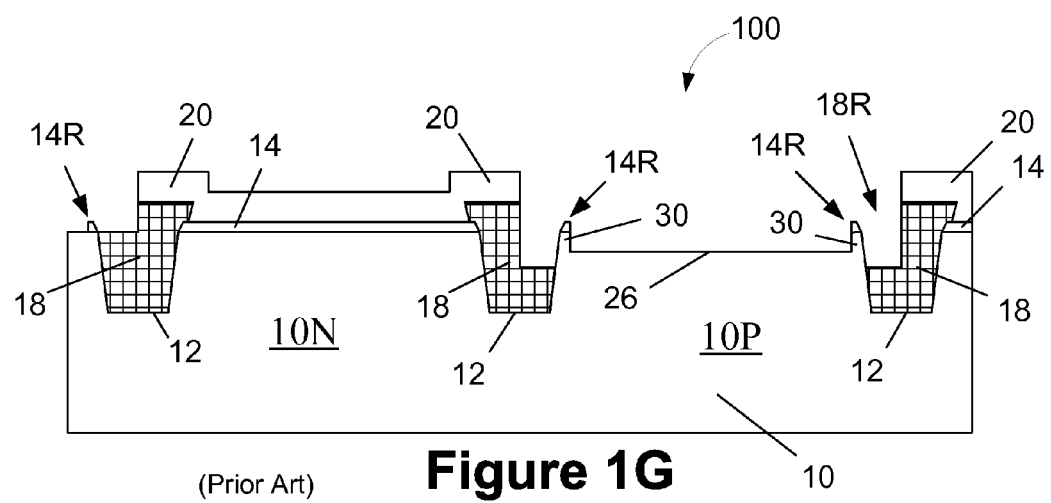
Figure 1H:
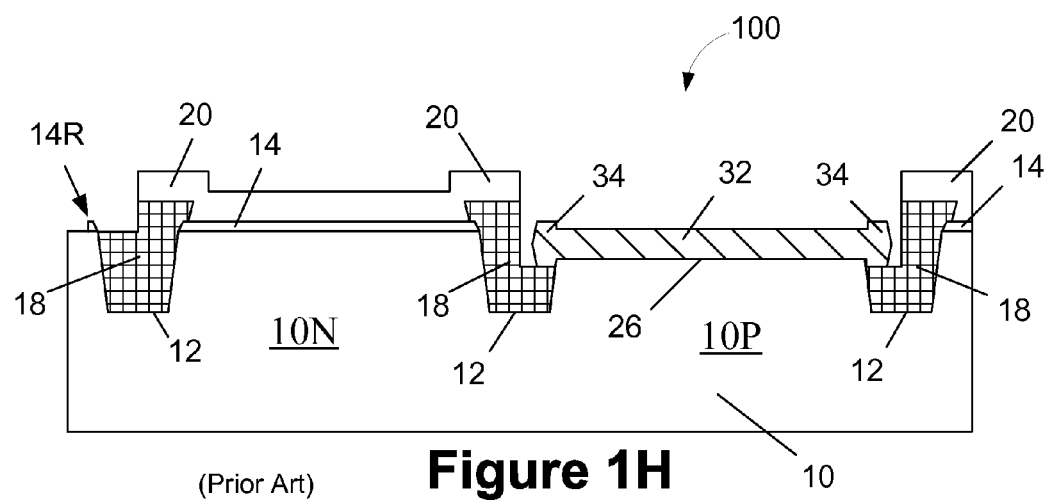

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of epitaxially forming materials on transistor devices. As will be readily apparent to those skilled in the art upon a complete reading of the present application, the present method is applicable to a variety of devices, including, but not limited to, logic devices, memory devices, etc. With reference to FIGS. 2A-2F, various illustrative embodiments of the methods and devices disclosed herein will now be described in more detail. To the extent that the same reference numbers are used in both FIGS. 1A-1H and FIGS. 2A-2F, the previous description of those structures applies equally to FIGS. 2A-2F.

Figure 2A:
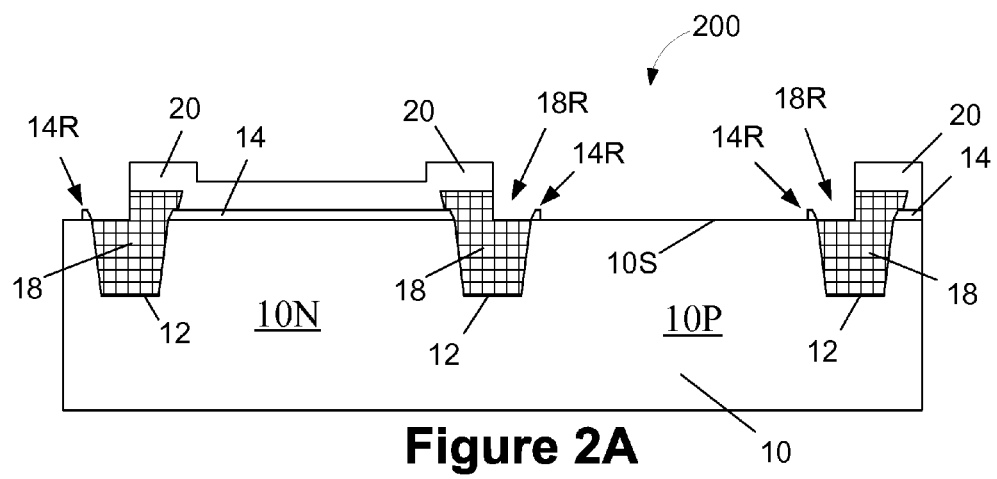
FIGS. 2A-2F depict various novel methods disclosed herein for epitaxially forming materials on transistor devices.

FIG. 2A is a simplified view of an illustrative semiconductor device 200 at an early stage of manufacturing. The semiconductor device 200 is formed above an illustrative bulk semiconducting substrate 10 having an upper surface 10S. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 10 may also be made of materials other than silicon. At the point of fabrication depicted in FIG. 2A, the device 200 has been processed in the same manner as that described above for the device 100 depicted in FIG. 1E. That is, pad oxide remnants 14R remain on the surface 10S of the P-active area 10P. As noted earlier, the pad oxide remnants 14R need not be a single continuous ring—it may only be residual, spaced-apart portions of the pad oxide layer 14.

Figure 2B:
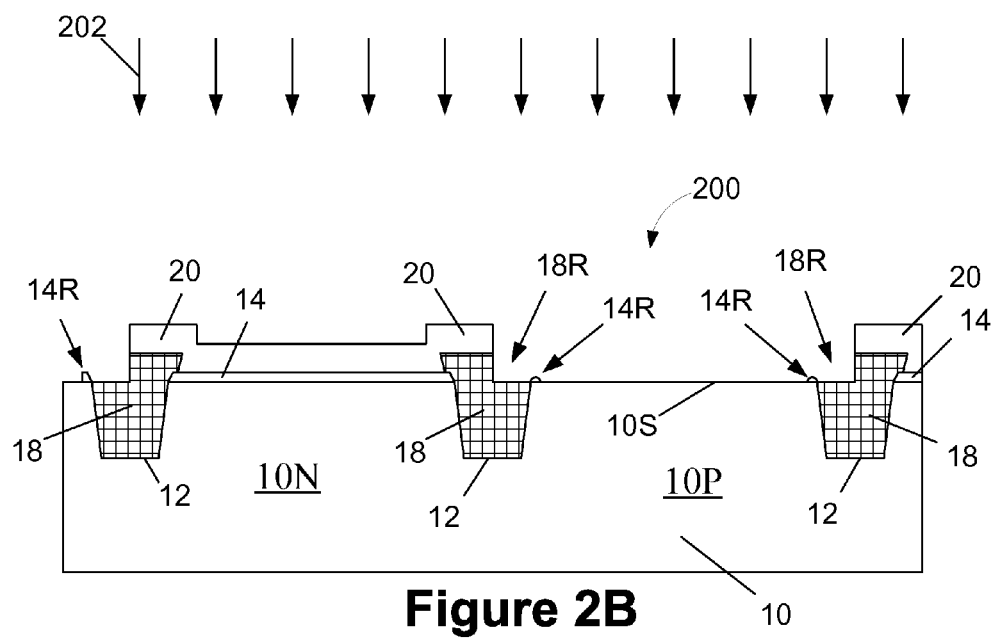

Next, as shown in FIG. 2B, a pre-clean process 202 is performed in an effort to remove the remnants 14R of the pad oxide layer 14. For purposes of this disclosure, the pad oxide remnants 14, e.g., a pad oxide ring is depicted as being less than completely removed by the pre-clean process 202, although in some cases, the pre-clean process may remove substantially all of the remnants of the pad oxide layer 14. In one illustrative embodiment, this pre-clean process 202 is performed using (APM/DHF) for a duration of about 30 seconds. In this illustrative example, the duration of the pre-clean process 202 is kept relatively short so as to reduce the amount of loss 18R of the isolation regions 18. In some cases, the pre-clean process 202 may remove about 3-5 nm of the isolation regions 18.

Figure 2C:
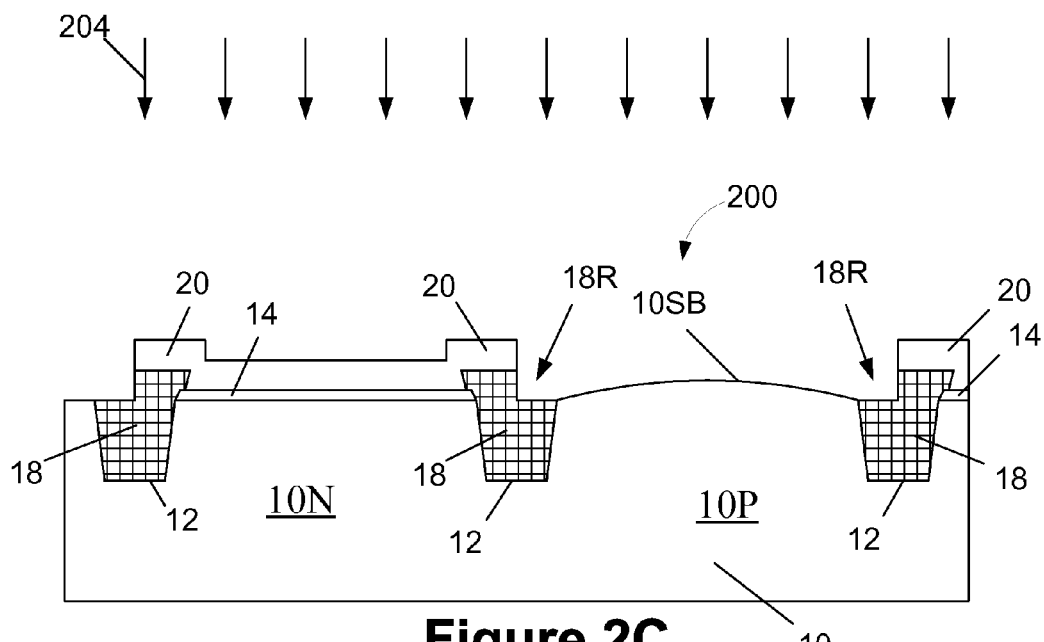

Next, as shown in FIG. 2C, a heating or baking process 204 is performed on the device 200. In one illustrative embodiment, the baking process 204 is performed at a temperature of about 820° C. for a relatively long period of time—about 300 minutes—using an effective hydrogen flow rate of less than 2 slm. Of course, those skilled in the art will recognize that this flow rate may be different depending upon whether or not the hydrogen is diluted, e.g., if inert gases are added to process, or if only hydrogen is employed in the process. If only hydrogen is employed during the process then the actual flow rate and the effective flow rate would be the same, i.e., less than 2 slm of hydrogen. As compared to the prior art baking conditions described previously, the parameters of the baking process disclosed herein leads to some unexpected and beneficial results. For example, the higher temperature and increased duration of the presently disclosed baking process 204 remove any remnants 14R of the pad oxide layer 14 from the surface 10S of the substrate 10 by dissolution. Additionally, reducing the flow rate of hydrogen in the present baking process 204 increases the migration of silicon atoms toward the surface 10S of the substrate 10. As a result, the P-active area 10P exhibits a bowed or convex surface 10SB, as schematically depicted in FIG. 2C. In one illustrative example, the center of the bowed surface 10SB may be raised relative to the edge of the active region 10P by about 3-10 nm. In some cases, this bowing may or may not be substantially uniform across the active region 10P.

Figure 2D:
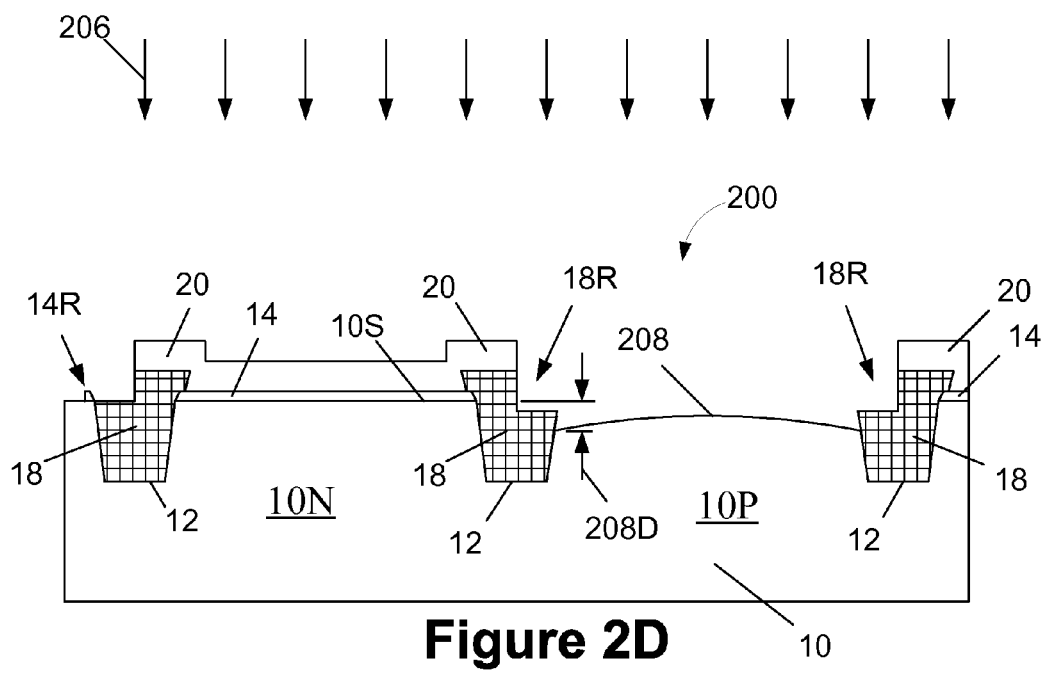
Figure 2E:
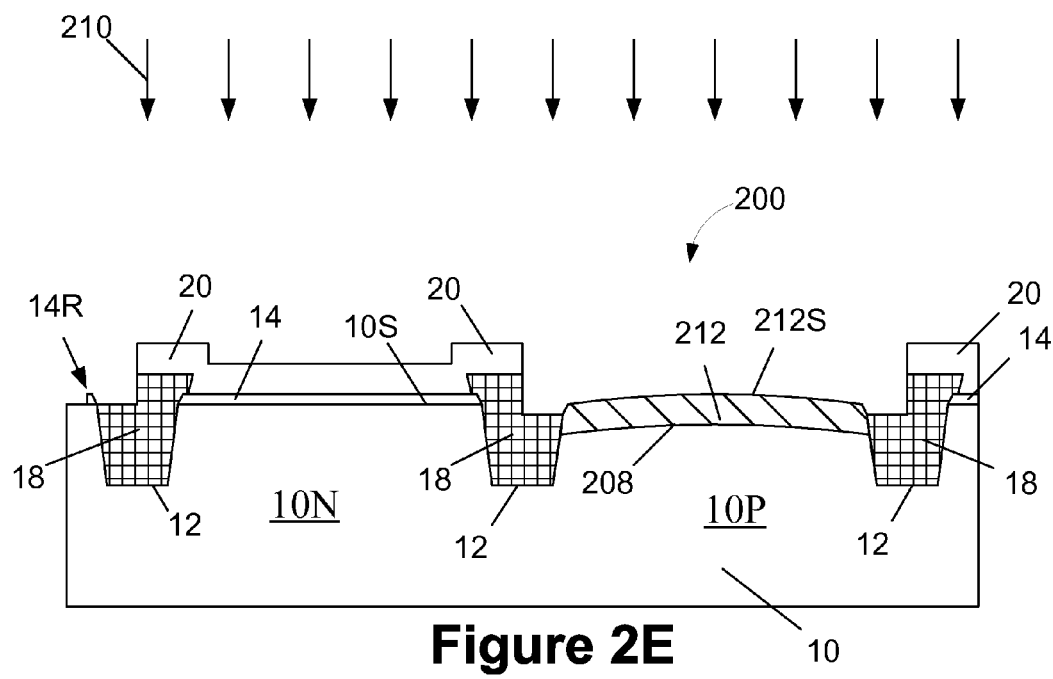

Next, as shown in FIG. 2D, an etching process 206 is performed to define a curved recess 208 in the P-active region 10P. Ultimately, a channel semiconductor material for a PFET transistor will be formed in the recess 208. The curved recess 208 generally has a configuration that corresponds to the bowed surface 10SB of the substrate 10. The etching process 206 may be either a wet or dry etching process. In one illustrative embodiment, the etching process 206 is a dry etching process that is performed using HCL based chemistry. The depth 208D of the recess 208 (relative to the original surface 10S of the substrate 10) may range from about 5-15 nm at the perimeter of the P-active region 10P, and the depth 208D may vary depending upon the particular application.

The next process involves the formation of a layer of channel semiconductor material 212 in the recess 208. In one illustrative example, the channel semiconductor material 212 is a layer of silicon germanium that is formed by performing an expitaxial deposition process 210. The channel semiconductor material 212 may have a nominal thickness that ranges from about 5-15 nm. The channel semiconductor material 212 has a curved upper surface 212S that corresponds to the shape of the curved recess 208. In one illustrative embodiment, the height of the semiconductor material 212 at its approximate mid-point is approximately even with the original surface 10S of the substrate 10.

As a broad overview, in addition to the significant differences in the baking process 204 described above relative to the prior art baking process described in the background section of this application, the presently disclosed subject matter differs from the prior art in the order in which various process steps are performed. The prior art process flow involved the process steps of 1) performing a pre-clean process; 2) perform an etching process to define a recess in the P-active region 10P; 3) performing the prior art heating process described in the background section of this application (800° C./30 minutes/4 slm $H_2$); and 4) perform an epitaxial deposition process to form the channel semiconductor material for the PFET transistor. In contrast, the novel process flow described herein involves the process steps of 1) performing a pre-clean process; 2) performing the novel, longer duration, higher-temperature, heating process 204 described herein (820° C./300 minutes/2.0 slm $H_2$) which results in the unexpected and beneficial curved surface 10SB of the P-active region 10P; 3) performing an etching process to define a curved recess 208 in the P-active region 10P; and 4) performing an epitaxial deposition process to form the channel semiconductor material 212 with a curved upper surface 212B for the PFET transistor and without the detrimental irregularly-shaped ends 34 shown in FIG. 1H.

Figure 2F:
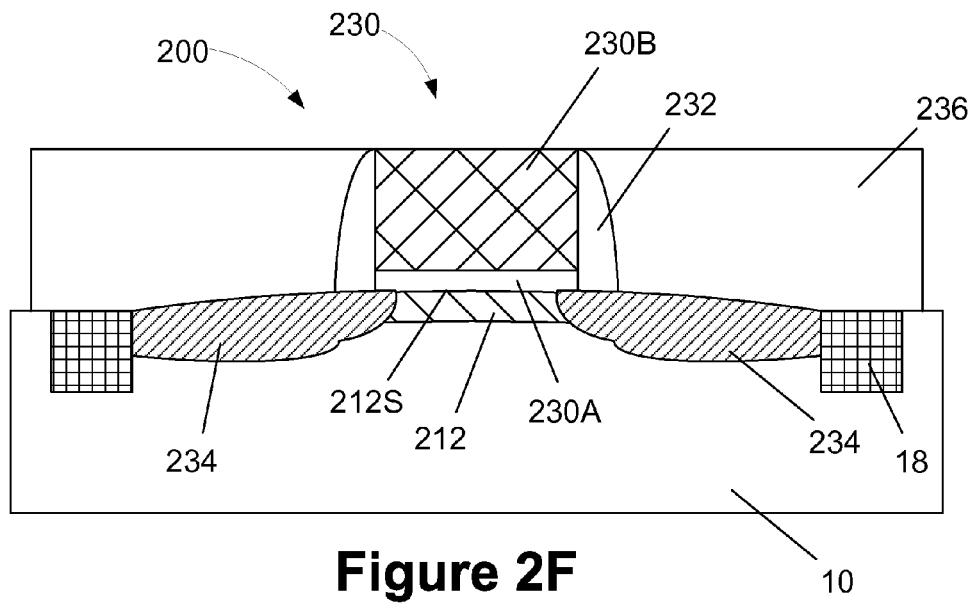

FIG. 2F is a schematic depiction of one illustrative embodiment of the device 200 at a later stage of fabrication. More specifically, the device 200 is an illustrative PFET transistor with a channel semiconductor material 212 having a curved or bowed upper surface 212S. In general, the illustrative PFET transistor comprises a gate structure 230 sidewall spacers 232 and source/drain regions 234. An illustrative insulation layer 236 is also depicted in FIG. 2F. In one embodiment, the gate structure 230 is comprised of a gate insulation layer 230A and a gate electrode 230B. Of course, those skilled in the art will recognize that the schematically depicted PFET transistor does not show all aspects of a real-world PFET transistor, such as various doped regions (halo regions), various conductive contacts, etc. The gate insulation layer 230A may be comprised of a variety of different materials, such as, for example, silicon dioxide, a so-called high-k (k greater than 10) insulation material, etc. Similarly, the gate electrode 230B may be made of a material such as polysilicon or amorphous silicon, or it may be comprised of one or more metal layers. As will be recognized by those skilled in the art after a complete reading of the present application, the gate structure 230 for the PFET transistor may be comprised of a variety of different materials and such a gate structures 230 may have a variety of configurations. Moreover, the gate structure 230 may be made using either so-called "gate-first" or "gate-last" techniques. Thus, the particular materials employed in the formation of the gate structure 230 and the manner in which is made should not be considered a limitation of the presently disclosed inventions. The source/drain regions 234 may be formed by performing a plurality of ion implantation process using any of a variety of different P-type dopant materials. Note that, due to the presence of the channel semiconductor material 212 with the curved upper surface 212S, the interface between the gate insulation layer 230A and the channel semiconductor layer 212 is along a curved surface. Of course, as will be recognized by those skilled in the art after a complete reading of the present application, the present invention is not limited to the formation of the illustrative PFET transistor depicted in FIG. 2F, as the subject matter disclosed herein may be employed with other types of semiconductor devices, like NFET transistors, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an isolation region in a semiconducting substrate, said isolation region defining an active area;
    performing a heating process on said active area to cause an upper surface of said active area to become a curved surface, wherein performing said heating process on said active area comprises performing a heating process at a temperature of at least 820° C. for a duration of at least 300 minutes;
    performing an etching process on said active area to define a recess having a curved bottom surface;
    forming a channel semiconductor material in said recess, said channel semiconductor material having a curved upper surface; and
    forming a gate structure for a transistor above said curved upper surface of said channel semiconductor material.

2. The method of claim 1, wherein performing said heating process further comprises performing said heating process using hydrogen at an effective flow rate of less than 2.0 slm.

3. The method of claim 1, forming said channel semiconductor material in said recess comprises performing an epitaxial deposition process to form said channel semiconductor material.

4. The method of claim 3, wherein said channel semiconductor material is silicon germanium.

5. The method of claim 1, wherein said transistor is a PFET transistor.

6. The method of claim 1, performing said heating process on said active area to cause said upper surface of said active area to become said curved surface comprises performing said heating process on said active area to cause said curved surface to have a maximum height that is 3-10 nm above an original surface of said semiconducting substrate.

7. The method of claim 1, wherein said isolation region is a shallow trench isolation region.

8. The method of claim 1, performing said etching process on said active area to define said recess having said curved bottom surface comprises performing a dry etching process on said active area to define said recess having said curved bottom surface.

9. A method, comprising:
    forming an isolation region in a semiconducting substrate, said isolation region defining an active area;
    performing a heating process on said active area to cause an upper surface of said active area to become a curved surface, wherein said heating process is performed at a temperature of at least 820° C. for a duration of at least 300 minutes using hydrogen at an effective gas flow rate of less than 2.0 slm;
    performing an etching process on said active area to define a recess having a curved bottom surface;
    forming a channel semiconductor material in said recess, said channel semiconductor material having a curved upper surface; and
    forming a gate structure for a transistor above said curved upper surface of said channel semiconductor material.

10. The method of claim 9, wherein performing said heating process on said active area to cause said upper surface of said active area to become said curved surface comprises performing said heating process on said active area to cause said curved surface to have a maximum height that is 3-10 nm above an original surface of said semiconducting substrate.

11. A method, comprising:
    forming an isolation region in a semiconducting substrate, said isolation region defining an active area;
    performing a heating process on said active area to cause an upper surface of said active area to become a bowed convex surface, wherein the center of the bowed convex surface is 3-10 nm higher than an edge of the active region;
    performing an etching process on said active area to define a recess having a curved bottom surface;
    forming a channel semiconductor material in said recess, said channel semiconductor material having a curved upper surface; and
    forming a gate structure for a transistor above said curved upper surface of said channel semiconductor material.

12. The method of claims 11, wherein performing said heating process on said active area comprises performing a heating process at a temperature of at least 820° C. for a duration of at least 300 minutes.

13. The method of claim, 12, wherein performing said heating process further comprises performing said heating process using hydrogen at an effective gas flow rate of less than 2.0 slm.

* * * * *